United States Patent
Naruoka et al.

(10) Patent No.: US 10,840,109 B2
(45) Date of Patent: Nov. 17, 2020

(54) TERMINAL, MOLDED PRODUCT FOR POWER MODULE PROVIDED WITH TERMINAL, AND METHOD OF MANUFACTURING MOLDED PRODUCT FOR POWER MODULE PROVIDED WITH TERMINAL

(71) Applicant: NAGASE & CO., LTD., Osaka (JP)

(72) Inventors: Tamanobu Naruoka, Kyoto (JP); Kenro Shibata, Tokyo (JP)

(73) Assignee: NAGASE & CO., LTD., Osaka (JP)

( * ) Notice: Subject to any disclaimer, the term of this patent is extended or adjusted under 35 U.S.C. 154(b) by 0 days.

(21) Appl. No.: 16/367,575

(22) Filed: Mar. 28, 2019

(65) Prior Publication Data

US 2019/0304802 A1 Oct. 3, 2019

(30) Foreign Application Priority Data

Mar. 29, 2018 (JP) .................................. 2018-063858

(51) Int. Cl.
| | |
|---|---|
| *H01L 21/48* | (2006.01) |
| *B29C 45/76* | (2006.01) |
| *H01L 23/498* | (2006.01) |
| *H01R 13/10* | (2006.01) |
| *B29C 45/14* | (2006.01) |

(Continued)

(52) U.S. Cl.
CPC .... *H01L 21/4846* (2013.01); *B29C 45/14639* (2013.01); *B29C 45/76* (2013.01);
(Continued)

(58) Field of Classification Search
CPC ........ B29C 45/14418; B29C 45/14467; B29C 45/14639; B29C 45/14139;
(Continued)

(56) References Cited

U.S. PATENT DOCUMENTS

| 4,168,394 A * | 9/1979 | Yuey ...................... H01B 17/30 |
| | | 174/11 R |
| 4,565,093 A * | 1/1986 | Jurva .................... H01M 2/065 |
| | | 429/90 |

(Continued)

FOREIGN PATENT DOCUMENTS

| EP | 2849290 A1 | 3/2015 |
| JP | 2017-45771 A | 3/2017 |

OTHER PUBLICATIONS

Aug. 23, 2019 European Search Report in European Application No. 19166198.2.

*Primary Examiner* — Timothy J Thompson
*Assistant Examiner* — Rhadames Alonzo Miller
(74) *Attorney, Agent, or Firm* — Greenblum & Bernstein, P.L.C.

(57) ABSTRACT

There are provided a method of manufacturing a molded product for a power module capable of integrally molding terminals and a substrate, and a terminal in a particular shape used for the manufacturing method. The method of manufacturing the molded product for a power module includes the steps of: inserting a first tip portion of each of terminals having a particular shape into a substrate; arranging the substrate in a mold such that the second tip portion is inserted into a terminal insertion portion inside the mold; and integrally molding the substrate and the terminals by flowing resin into the mold.

5 Claims, 6 Drawing Sheets

(51) Int. Cl.
*H05K 7/14* (2006.01)
*H01R 43/24* (2006.01)
*H01R 43/20* (2006.01)
*H01R 12/58* (2011.01)

(52) U.S. Cl.
CPC .. *H01L 23/49838* (2013.01); *H01L 23/49861* (2013.01); *H01R 12/585* (2013.01); *H01R 13/10* (2013.01); *H01R 43/205* (2013.01); *H01R 43/24* (2013.01); *H05K 7/1432* (2013.01); *B29C 45/14065* (2013.01); *B29C 45/14311* (2013.01); *B29C 45/14418* (2013.01); *B29C 45/14426* (2013.01); *B29C 45/14467* (2013.01); *B29C 2045/14139* (2013.01)

(58) Field of Classification Search
CPC ........... H01L 21/4846; H01L 23/49838; H01L 23/49861; H01L 12/585; H01L 13/10; H01L 43/24; H05K 7/1432
See application file for complete search history.

(56) References Cited

U.S. PATENT DOCUMENTS

| | | | | |
|---|---|---|---|---|
| 4,593,970 A | * | 6/1986 | Rhodes | G02B 6/4428 174/705 |
| 4,678,868 A | * | 7/1987 | Kraska | A61N 1/3754 174/152 GM |
| 4,727,223 A | * | 2/1988 | Lee | H01B 17/30 174/151 |
| 4,890,152 A | * | 12/1989 | Hirata | H01L 21/56 257/666 |
| 4,970,781 A | | 11/1990 | Chang et al. | |
| 5,144,412 A | * | 9/1992 | Chang | H01L 21/486 257/665 |
| 5,967,858 A | | 10/1999 | Yamada | |
| 2003/0027038 A1 | * | 2/2003 | Tsukamoto | H01M 2/0426 429/122 |
| 2003/0081370 A1 | * | 5/2003 | Haskell | H01G 4/35 361/306.1 |
| 2004/0101746 A1 | * | 5/2004 | Ota | H01M 2/06 429/161 |
| 2006/0178023 A1 | | 8/2006 | Matsumura | |
| 2008/0294220 A1 | * | 11/2008 | Stevenson | A61N 1/3754 607/36 |
| 2009/0120686 A1 | * | 5/2009 | Paterek | F04C 23/008 174/650 |
| 2010/0317239 A1 | | 12/2010 | Achammer et al. | |
| 2012/0067240 A1 | * | 3/2012 | Hartl | F42B 3/198 102/202 |
| 2015/0079851 A1 | | 3/2015 | Endo et al. | |
| 2016/0315022 A1 | | 10/2016 | Egusa et al. | |

\* cited by examiner

[Figure 1]

[Figure 5]
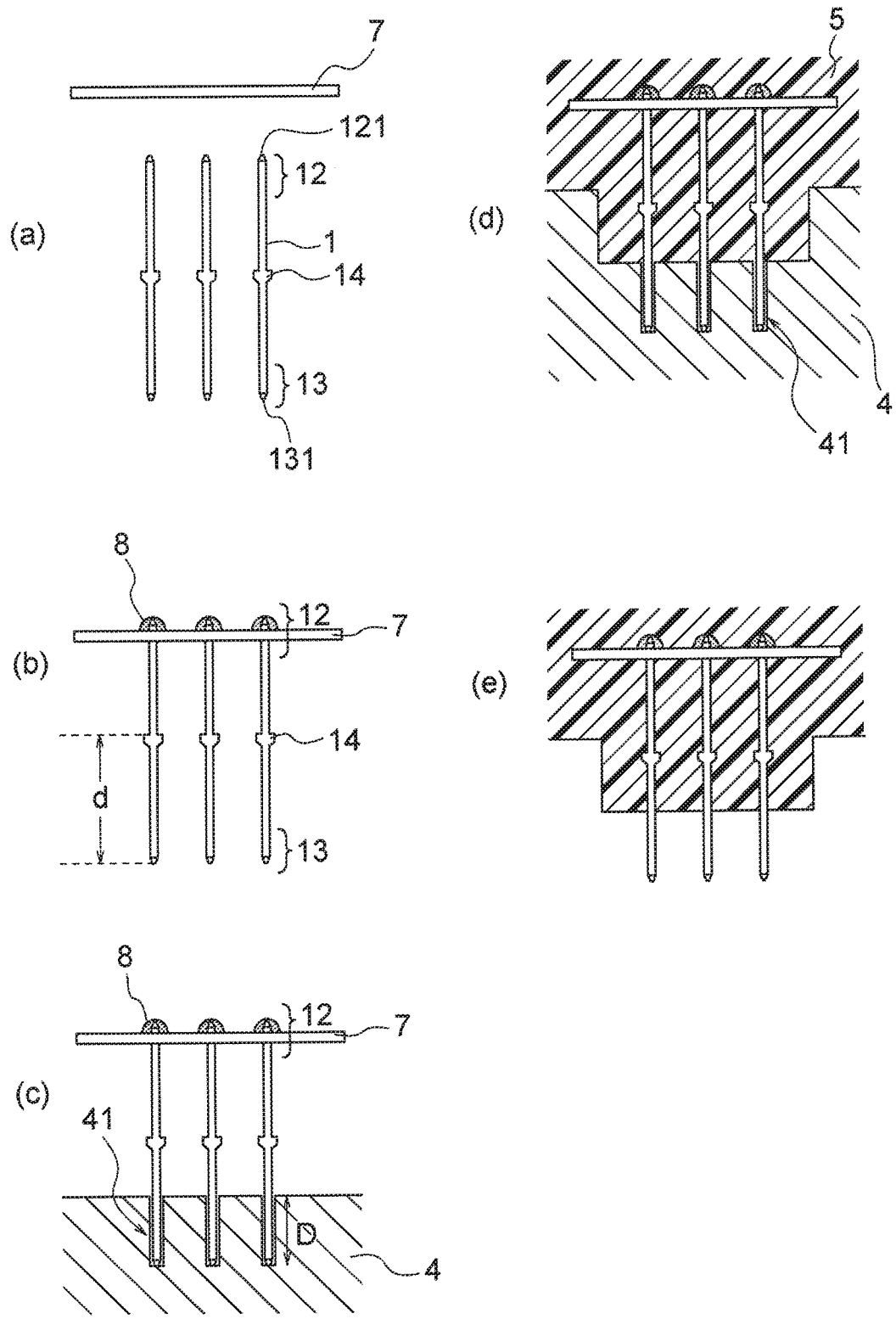

[Figure 6]
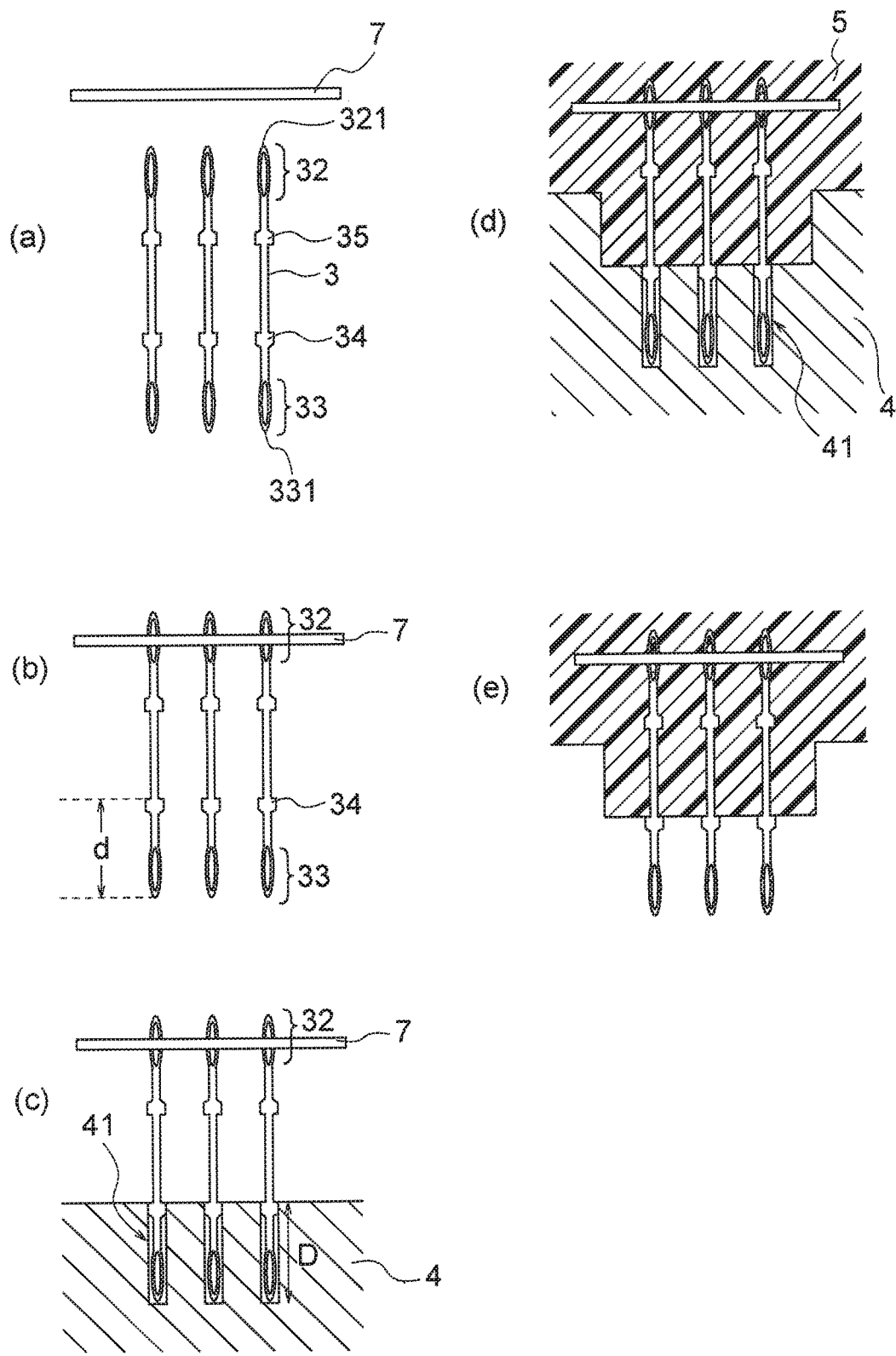

TERMINAL, MOLDED PRODUCT FOR POWER MODULE PROVIDED WITH TERMINAL, AND METHOD OF MANUFACTURING MOLDED PRODUCT FOR POWER MODULE PROVIDED WITH TERMINAL

BACKGROUND OF THE INVENTION

Field of the Invention

The present invention relates to a terminal, a molded product for a power module provided with the terminal, and a method of manufacturing the molded product for a power module provided with the terminal.

Description of the Related Art

Recently, onboard power (semiconductor) modules have attracted attention due to development of electric cars.

As shown in FIG. 1, a molded product for a power module provided with a plurality of terminals, which is used for an onboard power module, is manufactured by forming a coupling portion CC by resin molding to collect a plurality of terminals 1C together ((a) in FIG. 1), arranging the terminals 1C collected together by the coupling portion CC in a mold 4C ((b) in FIG. 1), flowing resin 5C into the mold 4C ((c) in FIG. 1) and finally removing the mold 4C ((d) in FIG. 1). That is, this is a manufacturing method of firstly making a pin block including the terminals 1C (primary molding) and then performing secondary molding. Though what is obtained by integrating a resin block with terminals is generally called a lead frame, a control terminal block, a signal terminal block or the like, it is collectively called a pin block in the present specification. That is, in the present specification, a pin block is meant to be a resin block integrated with a terminal.

As such a manufacturing method, for example, Document 1 mentioned below describes a power semiconductor module manufacturing method for the purpose of causing a power semiconductor module to be low and small. In the method disclosed in Document 1 also, a terminal block is manufactured first, and then insert molding is performed. That is, making of a terminal block is also performed in Document 1.

Document 1: Japanese Patent Laid-Open No. 2017-45771

SUMMARY OF THE INVENTION

However, if, after fabricating the coupling port CC (primary molding), the terminals 1C provided in the coupling portion CC are arranged in the mold 4C, and injection molding (secondary molding) is performed as described above, then the cost is high because two molding processes are performed. Further, if a slight dimensional error occurs in the primary molding, the error in the primary molding influences the secondary molding, and a large dimensional error is caused in a final product.

If the terminals 1C provided in the coupling portion CC in FIG. 2 are in a shape of being folded at right angles, a structure is obtained in which connection portions 131C, which are tips of one side of the terminals 1C, are arranged just below the terminals 1C, and it is a mechanism that is extremely restricted in connection with a main body substrate on which a power control semiconductor is implemented.

Furthermore, as seen from FIG. 2 showing a molded product for a power module manufactured by a conventional technique, a seam is generated between the coupling portion CC fabricated by the primary molding and a part that has been injection-molded after that (the secondary molding), and there may be a case where liquid sealing material etc. used for sealing of a semiconductor device enters the seam, and the sealing material leaks out to an unintended position through a gap generated at the seam.

If, in order to solve the above problem, the coupling portion CC is not manufactured, and integral molding is performed in a state in which terminals and the like are arranged in a mold, then troubles occur such as inclination or falling down of the terminals due to inflow of resin into the mold at the time of injection molding, and it becomes difficult to perform accurate resin molding. Furthermore, even if integral molding can be performed, there is a possibility that conventional straight-type terminals come out of a resin molding.

In order to solve the above problems, the inventors had continued intensive research and developed a novel terminal, a molded product for a power module obtained by performing resin integral molding in a state in which the terminals are inserted in a substrate, and a method of manufacturing the molded product for a power module.

That is, the present invention includes the following:

[1] A method of manufacturing a molded product for a power the method comprising the steps of:

preparing a terminal and a substrate, the terminal comprising a main body connecting two end portions, a first tip portion including one of the end portions, a second tip portion including an end portion on the opposite side of the first tip portion and a first expanded portion provided on the main body, an area of the first expanded portion being larger than an area of the main body relating to a cross section orthogonal to the longitudinal direction of the main body;

inserting the terminal into the substrate from the first tip portion;

arranging the substrate with the terminal in a mold such that the second tip portion is inserted into a terminal insertion portion inside the mold; and integrally molding the substrate and the terminal by flowing resin into the mold.

[2] The manufacturing method according to [1], wherein a length from a tip of the second tip portion to the first expanded portion is larger than a depth of the terminal insertion portion of the mold.

[3] The manufacturing method according to [1], wherein a length from a tip of the second tip portion to the first expanded portion is the same as or smaller than a depth of the terminal insertion portion of the mold.

[4] The manufacturing method according to [3], wherein the main body is further provided with a second expanded portion, and a length from the tip of the second tip portion to the second expanded portion is larger than the depth of the terminal insertion portion of the mold.

[5] A molded product for a power module comprising:

a resin case;

a substrate integrated with the case; and a terminal integrated with the case and connected to the substrate, wherein the terminal comprises a main body connecting two end portions, a first tip portion including one of the end portions, a second tip portion including an end portion on an opposite side of the first tip portion and a first expanded portion provided on the main body, an area of the first expanded portion being larger than an area of the main body relating to a cross section orthogonal to the longitudinal direction of the main body, the second tip portion being exposed from the case.

[6] A terminal comprising:
a main body connecting two end portions;
a first tip portion including one of the end portions;
a second tip portion including an end portion on an opposite side of the first tip portion; and
a first expanded portion provided on the main body, wherein
wherein an area of the first expanded portion being larger than an area of the main body relating to a cross section orthogonal to the longitudinal direction of the main body.

[7] The terminal according to [6], wherein the main body is further provided with a second expanded portion, and, when a first part including the first tip portion and a second part including the second tip portion are seen from the center point of the terminal in the longitudinal direction, the first part and the second part have the same shape.

A method of manufacturing a molded product for a power module according to the present invention can integrate terminals with a substrate by insert molding without making a pin block and manufacture an injection molding without a seam (a juncture). The injection molding without a seam can prevent other resin such as liquid sealing material from entering a seam. Furthermore, since the manufacturing method of the present invention can manufacture a power module by performing injection molding once in a state in which terminals are directly inserted in a substrate without making a terminal block (a pin block), the cost is low, and, in addition, it is possible to manufacture the power module with a high accuracy because a dimensional error of a pin block (the coupling portion CC in FIG. 1) does not influence the molded product for a power module.

Furthermore, since it is possible to set pressure, temperature and the like for injection molding (insert molding) without taking into account existence of a pin block, the degree of freedom of molding conditions can be increased. Further, by inserting the terminals in the substrate and arbitrarily providing a wiring pattern of the substrate, the connection portions 131C which are tips of the terminals 1C shown in FIG. 2 can be arranged, for example, at positions shown in FIG. 4 without being fixed just below tips on the other side. Specifically, when an L-shaped substrate including a wiring pattern thereon is used, the connection portions of the substrate may be exposed at positions other than the positions just below the tips as shown in FIG. 4. Thereby, the degree of freedom of implementation of the main body substrate can be improved.

Even when the thickness of the substrate is changed, the amount of insertion of the terminals into the substrate can be freely changed because the terminals are in a state of not being pin-blocked.

BRIEF DESCRIPTION OF THE DRAWINGS

FIG. 5 is a schematic diagram showing a method of manufacturing the molded product for a power module 100 using the terminals 1; and FIG. 6 is a schematic diagram showing a method of manufacturing a molded product for a power module 101 using press-fit terminals 3.

DETAILED DESCRIPTION OF THE PREFERRED EMBODIMENTS

The present invention will be described in detail below by giving an embodiment. The present invention, however, is not limited to the embodiment.

EMBODIMENT

[Terminal]

First, a terminal (a control terminal) used in a molded product for a power module manufacturing method of the present invention will be described.

Figure 3:
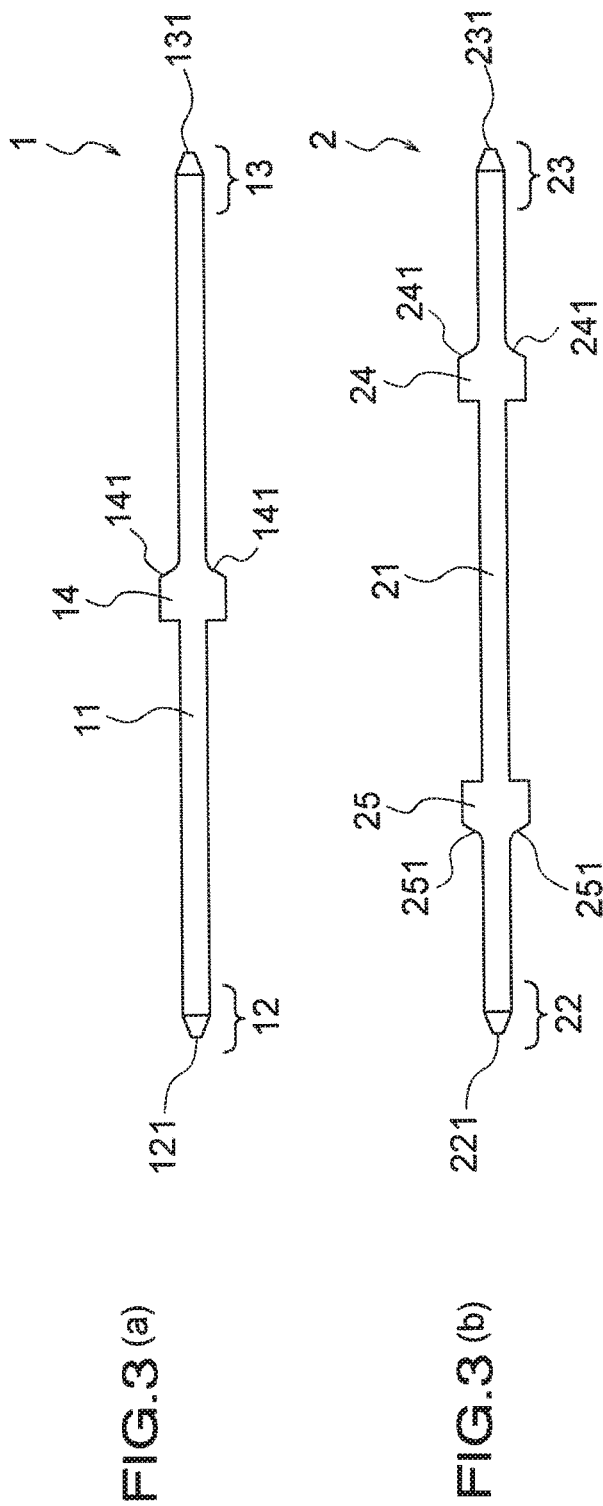
FIG. 3(a) is a front view of a terminal 1.
FIG. 3(b) is a front view of a terminal 2.

FIG. 3(a) shows a terminal 1 which is an embodiment. The terminal 1 is provided with a main body 11 connecting two end portions, a first tip portion 12 including one end portion 121 of the main body 11, a second tip portion 13 including an end portion 131 on the opposite side of the first tip portion 12, and a first expanded portion 14 provided on the main body 11.

The main body 11 constitutes the main body of the terminal 1. The terminal 1 is for electrically connecting a substrate with an electrical part such as another substrate to flow an electric current. Therefore, it is preferable that the main body 11 is in a pin shape with a predetermined length.

Though a cross section of the main body 11 orthogonal to the longitudinal direction is in a rectangular shape, the cross section can be appropriately changed according to a module or a mold. A polygon such as a square, a circle, an oval and the like are also possible.

The first tip portion 12 has a shape to be inserted into a through hole of the substrate. Therefore, in order to make it easy to insert the first tip portion 12 of the terminal 1 into the substrate, the end portion 121 of the first tip portion 12 is in a tapered shape. By inserting the first tip portion 12 into the substrate and applying solder from the opposite side of the substrate, the terminal 1 and the substrate are connected.

The second tip portion 13 is a part including the end portion 131 on the opposite side of the first tip portion 12 of the main body 11. The second tip portion 13 has a shape to be connected not to the substrate to which the first tip portion 12 of the terminal 1 is connected but to an electrical part (a connected apparatus) such as another circuit board. Therefore, the second tip portion 13 can be appropriately changed according to the shape of a connection part of the connected apparatus. The end portion 131 is also thinner than the main body 11 and is in a tapered shape. Since the end portion 131 is thus thinner, it is easy to insert the end portion 131 into a through hole provided in another substrate. The terminal 1 can be fixed to another circuit board or the like by solder.

The terminal 1 is provided with the first expanded portion 14 on the main body 11. A cross section of the first expanded portion 14 vertical to the longitudinal direction of the main body 11 is in a rectangular shape but can be appropriately changed according to a mold or the like. The first expanded portion 14 is thicker than the main body 11. That is, the area of the cross section of the first expanded portion 14 orthogonal to the longitudinal direction of the main body 11 is larger than the area of the cross section of the main body 11 orthogonal to the longitudinal direction of the main body 11.

FIG. 3(b) shows a terminal 2 of another aspect. The terminal 2 is provided with a main body 21, a first tip portion 22 including one end portion 221 of the main body 21, a second tip portion 23 including an end portion 231 on the opposite side of the first tip portion 22, a first expanded portion 24 provided on the main body 21, and a second expanded portion 25.

The terminal 2 is provided with the second expanded portion 25 in addition to the first expanded portion 24. When a first part including the first tip portion 22 and a second part including the second tip portion 23 are seen from the center point of the terminal 2 in the longitudinal direction, the first part and the second part have the same shape. That is, the first and second parts have symmetrical shapes relative to the center point of the terminal 2 in the longitudinal direction. The first expanded portion 24 is included in the second part, and the second expanded portion 25 is included in the first part. In this case, it goes without saying that the first expanded portion 24 and the second expanded portion 25 are in the same shape.

The first tip portion 12 or the second tip portion 13 of the terminal 1 shown in FIG. 3(a) and the first tip portion 22 or the second tip portion 23 of the terminal 2 shown in FIG. 3(b) may be in a shape to be press-fitted. By causing the first or second tip portion to be in a shape to be press-fitted, the terminal 1 or the terminal 2 is kept without using solder, and it is possible to electrically connect the terminal 1 or the terminal 2 to the substrate. Further, since it is not necessary to use solder, it is possible to use high heat-resistant resin without worrying about the melting point of solder. Both of the first tip portion 12 and the second tip portion 13 or both of the first tip portion 22 and the second tip portion 23 may be in a shape to be press-fitted.

In the present specification, press-fitting refers to pressing a tip of a terminal into a through hole provided in a substrate such as a circuit board and, by restoring force generated in the state of being pressed in, causing the terminal to be in contact with the substrate to maintain a state in which electrification is enabled.

For example, as shown in FIG. 6, the shape for press-fitting is such an oval shape that has an oval hole in the center. By first tip portions having such a shape, the terminal and the substrate can be in contact with each other and maintained by inserting the first tip portions into through holes in a particular shape provided in the substrate. The tip of the shape for press-fitting is sharp-pointed to be easily inserted into the substrate.

[Molded Product for a Power Module]

Figure 4:
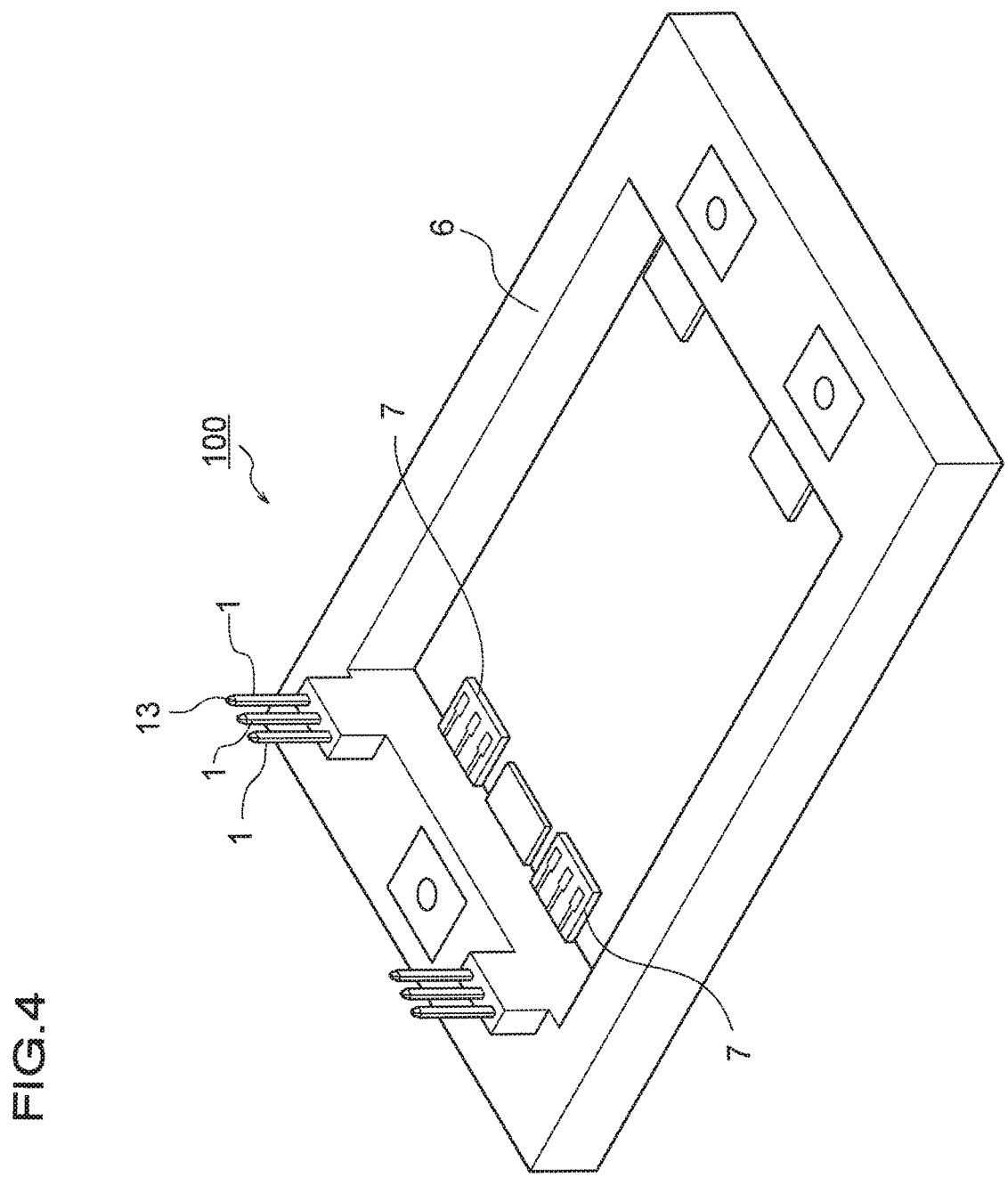
FIG. 4 is a perspective view of a molded product for a power module 100 provided with terminals 1.

Next, the molded product for a power module of the present invention will be described. FIG. 4 shows a molded product for a power module 100 provided with the terminals 1. The molded product for a power module 100 is a power module that can be electrically connected to a connected apparatus and includes a resin case 6, a substrate 7 integrated with the case 6, and the terminals 1 which are integrated with the case 6 and the second tip portions 13 of which are exposed from the case 6. Since the molded product for a power module 100 is integrally molded, there is not a resin seam that exists in a molded product for a power module 100C by a conventional manufacturing method.

Metallic parts and the like other than the terminals 1 and the substrate 7 can also be provided by integral molding though it is not shown in FIG. 4.

It is possible to make the molded product for a power module 100 of the present invention a power semiconductor module by further providing a semiconductor device, a lead frame and the like. The power semiconductor module can be connected to a connected apparatus via the second tip portions 13.

[Manufacture of Molded Product for a Power Module 100 Using Terminals 1]

Next, manufacture (integral molding) of the molded product for a power module 100 according to the present invention will be described. According to the manufacturing method of the present invention, it is possible to manufacture the molded product for a power module 100 by integrating the terminals 1 and the substrate 7 by performing injection molding once.

Specifically, the method of manufacturing the molded product for a power module 100 according to the present invention includes a step of inserting the first tip portions 12 of the terminals 1 into the substrate 7, a step of arranging the substrate 7 with terminal 1 in a mold 4 such that the second tip portions 13 are inserted into terminal insertion portions 41 in the mold 4 and a step of integrally molding the substrate 7 and the terminals 1 by flowing resin 5 into the mold 4.

The method of manufacturing the molded product for a power module 100 according to the present invention will be specifically described using FIG. 5. First, the terminals 1 and the substrate 7 are prepared and then, the first tip portions 12 of the terminals 1 of the present invention are inserted into through holes in the substrate 7 (FIGS. 5(a) and 5(b)). The first tip portions 12 are connected by solder 8 from the side of the substrate 7 opposite to the side where the first tip portions 12 are inserted.

In a state in which the terminals 1 are kept in the substrate 7, the second tip portions 13 of the terminals 1 are inserted into the terminal insertion portions 41 of the mold 4 corresponding to the terminals 1, respectively (FIG. 5(c)). At this time, a depth D of the terminal insertion portions 41 of the mold 4 (shown in FIG. 5(c)) and a distance d from the end portions 131 of the second tip portions 13 to parts of the first expanded portions 14 that are the nearest to the first tip portions 12 (shown in FIG. 5(b)) are in a relationship of d>D. Thereby, the first expanded portions 14 are located inside the resin 5 (the case 6), and, therefore, the terminals 1 are in a state of not easily coming off from the resin 5 (the case 6) due to frictional resistance.

In the case of the terminal 2 in FIG. 3(b), there are two main body expanded portions, the first expanded portion 24 and the second expanded portion 25. In manufacture of the molded product for a power module 100 using the terminals 2, the depth D of the terminal insertion portions 41 of the mold 4 and a distance d from the end portions 231 of the second tip portions 23 to parts of the first expanded portions 24 that are the nearest to the first tip portions 22 are in a relationship of d=D or d<D. If the first expanded portions 24 satisfy the relationship of d=D or d<D, it is possible to prevent resin 5 from flowing into the terminal insertion portions 41, and it is possible to cause the tips of the terminals 2 to come out from the resin 5 after molding. A distance d' from the second expanded portions 25 to the end portions 231 of the second tip portions 23 satisfies a relationship of d'>D.

In the case of the terminal 2 in FIG. 3(b), a first connection portion 241 on the second tip portion 23 side of the main body 21 is inclinedly connected to the first expanded portion 24 and has a tapered shape. Therefore, the first connection portion 241 can be smoothly inserted into the terminal insertion portions 41 without damage. As shown in FIG.

3(b), the second expanded portion 25 of the terminal 2 can also have a similar tapered shape.

In a state in which the terminals 1 are inserted in the terminal insertion portions 41 of the mold 4, the resin 5 is flowed into the mold 4 to perform integral molding (FIG. 5(d)).

After the resin 5 is cured to a predetermined hardness, the mold 4 is removed (FIG. 5(e)). Through these processes, such a molded product for a power module 100 that is connected to the substrate 7 inside the case 6 of the molded product for a power module 100 and that the second tip portions 13 are exposed from the resin 5 (the case 6) can be integrally molded.

[Manufacture of Molded Product for a Power Module 101 Using Press-Fit Terminals 3]

Next, the manufacture (integral molding) of a molded product for a power module 101 using a press-fit terminal 3 will be described. A first tip portion 32 and a second tip portion 33 of the press-fit terminal 3 have shapes to be press-fitted. The press-fit terminal 3 is also provided with two main body expanded portions, a first expanded portion 34 and a second expanded portion 35.

A method of manufacturing the molded product for a power module 101 using the press-fit terminals 3 will be described using FIG. 6 (an overall view of the molded product for a power module 101 is not shown in a drawing) The method of manufacturing the molded product for a power module 101 includes processes that are basically similar to the process of "Manufacture of molded product for a power module 100 using terminals 1" described using FIG. 5.

However, when the first tip portions 32 of the press-fit terminals 3 are inserted into the substrate 7, the first tip portions 32 can be electrically connected and fixed without using solder because the first tip portions 32 have the shape to be press-fitted (see FIG. 6(b)).

A maximum width of the first expanded portion 34 is set larger than a maximum width of the second tip portion 33. In the case of a press-fit terminal, the tip portion is in a partially bent shape. Therefore, it may be difficult to cause the cross-sectional shape of the insertion portion of the terminal 1 and the shape of the first tip portion 32 of the terminal 1 to correspond to each other without a gap. Not only by causing the maximum width of the first expanded portion 34 to be larger than the maximum width of the second tip portion 33, but also by causing the shape of the first expanded portion 34 to substantially correspond to the shape of the terminal insertion portion 41 of the mold 4, it becomes possible to prevent outflow of resin 5 to the mold side.

That is, the first expanded portions 34 of the terminals 3 are adapted to be included in the terminal insertion portions 41. Specifically, by causing d=D or d<D to be satisfied as shown in FIG. 6, the first expanded portions 34 play a role as covers of the terminal insertion portions 41 to cover the terminal insertion portions 41. Therefore, it becomes difficult for the resin 5 to enter the terminal insertion portions 41. By causing the shape of a cross section of the first expanded portion 34 orthogonal to the longitudinal direction to correspond to the shape of the terminal insertion portion 41, it is possible to suppress most of outflow of the resin 5 to the terminal insertion portion 41. Thereby, it is possible to cause the second tip portions 33 to be exposed from the case 6 made of the resin 5 (FIG. 5(e)). At this time, the second expanded portions 35 are provided on parts outside the terminal insertion portions 41.

As described above, though the case of using the press-fit terminals 3 is different from the case of using the terminals 1 in that solder is not used for connection with the substrate 7, the method of manufacturing a molded product for a power module according to the present invention can be implemented.

In a molded product for a power module obtained by the manufacturing method of the present invention, a seam does not occur on resin. For example, in the case of implementing a semiconductor in the molded product for a power module and, after that, enclosing resin with liquid sealant or the like, the liquid sealant does not enter a seam, and the sealing material does not leak out to an unintended position.

Effects of the above embodiment will be described below with the case of using the terminals 1 as an example.

[Effects]

Figure 1:
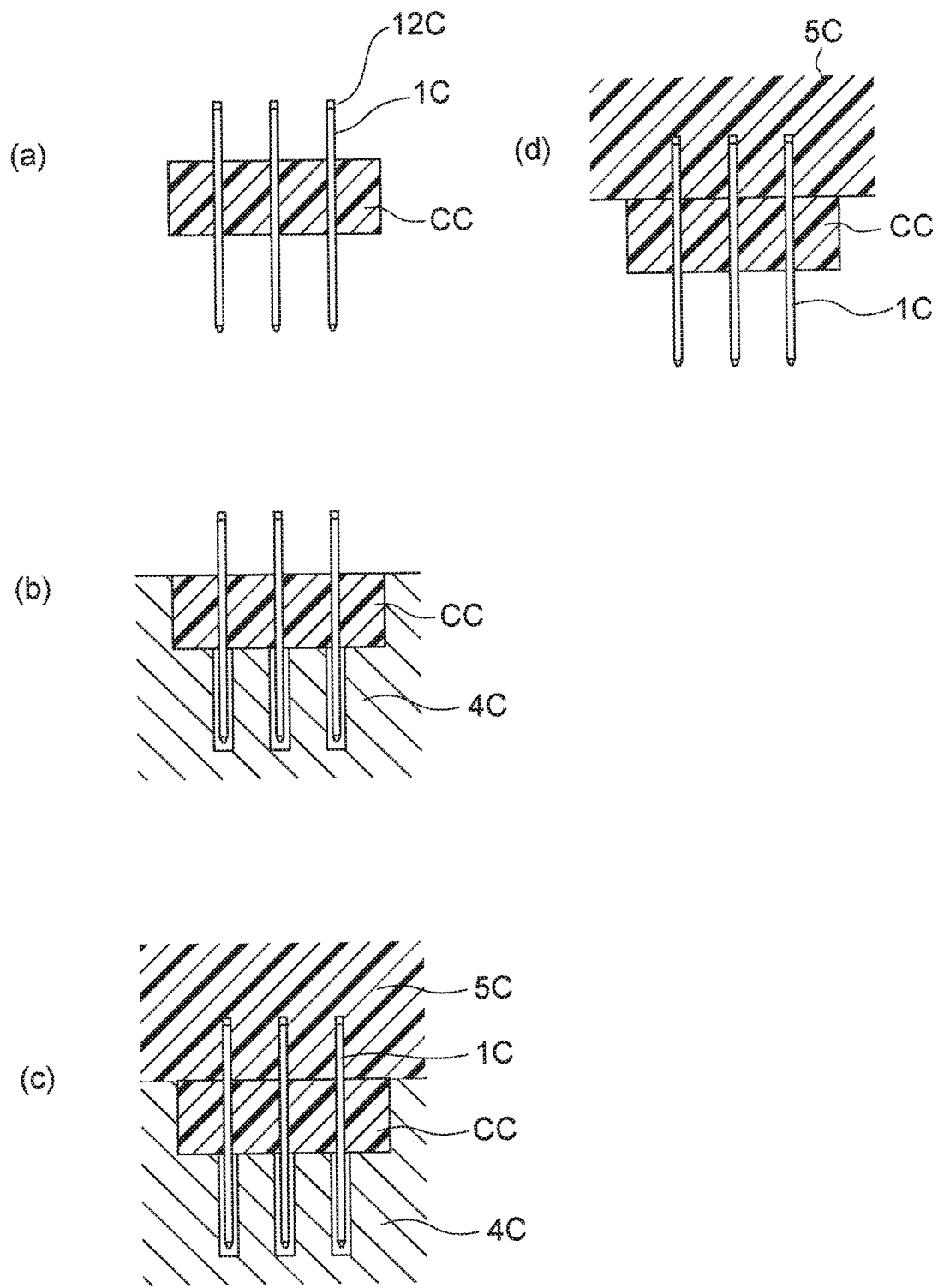
FIG. 1 is a schematic diagram of a method of manufacturing a molded product for a power module 100C using terminals 1C that has been conventionally implemented.
Figure 2:
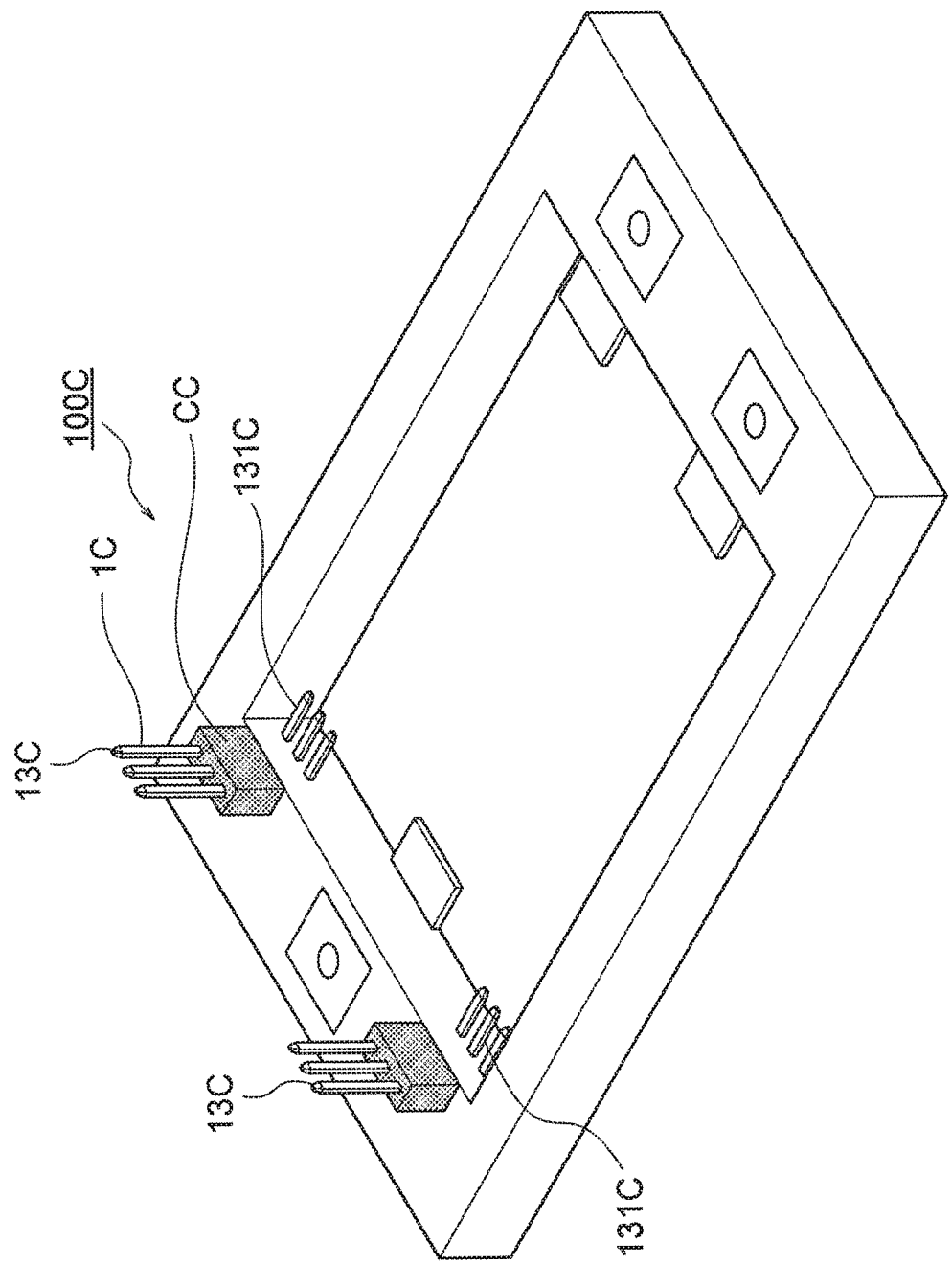
FIG. 2 is a perspective view of the molded product for a power module 100C provided with the terminals 1C, which has been manufactured by the conventional method.

[1] A method of manufacturing a molded product for a power module 100, the method including the steps of preparing a terminal 1 and a substrate 7, the terminal 7 comprising a main body 11 connecting two end portions, a first tip portion 12 including one of the end portions, a second tip portion 13 including an end portion on the opposite side of the first tip portion 12 and a first expanded portion 14 provided on the main body 11, an area of the first expanded portion 14 being larger than an area of the main body 11 relating to a cross section orthogonal to the longitudinal direction of the main body 11; inserting the terminal 1 into the substrate 7 from the first tip portion 12; arranging the substrate 7 with the terminal 1 in a mold 4 such that the second tip portion 13 is inserted into a terminal insertion portion 41 inside the mold 4, and integrally molding the substrate 7 and the terminals 1 by flowing resin 5 into the mold 4, is not required to making a pin block (primary molding) of the terminal 1, and, therefore, dimensional accuracy is improved because there is not dimensional variation of a primary molded product or a mold clearance. Specifically, since a pin block manufactured by a conventional technique (the coupling portion CC in FIG. 1) is a resin molded product, an error of ±0.1 mm occurs as a general tolerance in the case of a pin block for a molded product for a power module of the present invention in consideration of shrinkage of resin, pressure at the time of injection molding and the like. In addition, as for a clearance for a mold in primary molding, dimensional variation of a minimum of 0.03 mm to a maximum of 0.13 mm occurs. On the other hand, according to the manufacturing method of the present invention, since it is not necessary to perform primary molding, a clearance for a mold in primary molding is not required, and a final error is within 0 to 0.1 mm. Thus, the manufacturing method is extremely superior to the conventional manufacturing method from the view point of accuracy.

Furthermore, in the case where a pin block (the coupling portion CC) exists, a flow of resin at the time of injection molding is hindered. On the other hand, in the case of the manufacturing method of the aspect of the present invention, there are only terminals without a pin block, and the flow resistance of resin is low. Therefore, it is possible to set pressure, temperature and the like at the time of molding and increase the degree of freedom of molding conditions.

Furthermore, when the thickness of a substrate or the like was changed, it was necessary to change a pin block itself because of an amount of insertion of terminals and the like in the case of the conventional manufacturing method, but it is possible to flexibly respond to various changes by directly inserting the terminals 1 into the substrate 7.

In the conventional method, in the case of changing positions of the terminals 1, it was necessary to move the whole pin block and move a plurality of pins at the same time, and, therefore, a movable range was restricted. In the method of the present invention, however, the terminals 1 are inserted into the substrate 7 one by one, and it is possible to decide positions of the terminals 1 on the substrate 7 one by one. Therefore, it is possible to increase the degree of freedom of design of the substrate 7 side about arrangement of the terminals 1. Especially, when the number of pins increases, positions where the pins can be inserted in a substrate are restricted, and, therefore, it is effective that a position can be adjusted for each pin. Furthermore, since the plurality of terminals 1 can be efficiently arranged, it leads to downsizing of the substrate 7 and, therefore, leads to downsizing of the whole power module.

[2] In the manufacturing method of the preceding item [1], if a length from tips of the second tip portions 13 to the first expanded portions 14 is larger than a depth of the terminal insertion portions 41 of the mold 4, it becomes difficult for the terminals 1 to easily come off from the resin 5 due to frictional resistance.

[3] In the manufacturing method of the preceding item [1], if a length from tips of the second tip portions 13 to the first expanded portions 14 is the same as or smaller than a depth of the terminal insertion portions 41 of the mold 4, it is possible to prevent inflow of the resin 5 into the terminal insertion portions 41 and cause the second tip portions 13 to be exposed from a resin surface (the case 6). Further, it is also possible to prevent the terminals 1 from being inclined by pressure of inflow of resin at the time of molding.

[4] In the manufacturing method of the preceding item [3], if the main body 11 is further provided with the second expanded portion 25, and a length from the tip of the second tip portions 23 to the second expanded portions 25 is larger than the depth of the terminal insertion portions 41 of the mold 4, then it becomes more difficult for the terminals 1 to come off from the resin 3 than the case of the preceding item (3).

[5] A molded product for a power module 100 including: a resin case 6; a substrate 7 integrated with the case 6; and a terminal 1 integrated with the case 6 and connected to the substrate 7, the terminal 1 including a main body 11 connecting two end portions, a first tip portion 12 including one of the end portions, a second tip portion 13 including an end portion on an opposite side of the first tip portion 12 and a first expanded portion 14 provided on the main body 11, an area of the first expanded portion 14 being larger than an area of the main body 11 relating to a cross section orthogonal to the longitudinal direction of the main body 11, the second tip portion 13 being exposed from the case 6, is by integral molding, and, therefore, it is not necessary to perform primary molding (it is not necessary to make any terminal block.) beforehand, and a seam on a molding does not occur. Therefore, it is possible to prevent liquid sealing material or the like used for sealing of a semiconductor from entering the seam and leaking out to an unintended position.

[6] A terminal 1 including: a main body 11 connecting two end portions; a first tip portion 12 including one of the end portions, a second tip portion 13 including an end portion on an opposite side of the first tip portion 12; and a first expanded portion 14 provided on the main body 11, wherein an area of the first expanded portion is larger than an area of the main body relating to a cross section orthogonal to the longitudinal direction of the main body makes it possible to manufacture a molded product for a power module by integral molding while suppressing a dimensional error.

[7] In the terminal according to the preceding item [6], if the main body 21 is further provided with a second expanded portion 25, and, when a first part including the first tip portion 22 and a second part including the second tip portion 23 are seen from the center point of the terminal 2 in the longitudinal direction, the first part and the second part have the same shape, the terminal 2 can be used even if being turned upside down. Therefore, the terminal 2 can be set into the substrate 7 without worrying about the direction of the terminal 2.

REFERENCE SIGNS LIST

1,2,3 terminal (press-fit terminal)
11, 21, 31 main body
12, 22, 32 first tip portion
13, 23, 33 second tip portion
14, 24, 34 first expanded portion
25, 35 second expanded portion
4 mold
41 terminal insertion portion
5 resin
6 case (cured resin)
7 substrate
8 solder
100, 101 molded product for a power module

What is claimed is:

1. A method of manufacturing a molded product for a power module, the method comprising the steps of:
    preparing a terminal and an L-shaped substrate with a first portion and a second portion that is perpendicular to the first portion and has a wiring portion, the L-shaped substrate being in the form of a plate, which is L-shaped in a plane orthogonal to the longitudinal axis of the terminal, the terminal comprising a main body connecting two end portions, a first tip portion including one of the end portions, a second tip portion including an end portion on the opposite side of the first tip portion and a first expanded portion provided on the main body, an area of the first expanded portion being larger than an area of the main body relating to a cross section orthogonal to the longitudinal direction of the main body;
    inserting the terminal into the L-shaped substrate from the first tip portion;
    arranging the L-shaped substrate with the terminal in a mold such that the second tip portion is inserted into a terminal insertion portion inside the mold; and
    integrally molding the L-shaped substrate and the terminal by flowing resin into the mold so that the wiring portion of the second portion of the L-shaped substrate is exposed for connection to another apparatus at a position spaced from a vertical line passing through a longitudinal axis of the terminal.

2. The manufacturing method according to claim 1, wherein a length from a tip of the second tip portion to the first expanded portion is larger than a depth of the terminal insertion portion of the mold.

3. The manufacturing method according to claim 1, wherein a length from a tip of the second tip portion to the first expanded portion is the same as or smaller than a depth of the terminal insertion portion of the mold.

4. The manufacturing method according to claim 3, wherein the main body is further provided with a second expanded portion, and a length from the tip of the second tip portion to the second expanded portion is larger than the depth of the terminal insertion portion of the mold.

5. A molded product for a power module comprising:
a resin case;
an L-shaped substrate integrated with the case having a first portion and a second portion that is perpendicular to the first portion and has a wiring portion; and
a terminal integrated with the case and connected to the L-shaped substrate, wherein
the L-shaped substrate is in the form of a plate, which is L-shaped in a plane orthogonal to the longitudinal axis of the terminal,
the terminal comprises a main body connecting two end portions, a first tip portion including one of the end portions, a second tip portion including an end portion on an opposite side of the first tip portion and a first expanded portion provided on the main body, an area of the first expanded portion being larger than an area of the main body relating to a cross section orthogonal to the longitudinal direction of the main body, the second tip portion being exposed from the case, and
the wiring portion of the second portion of the L-shaped substrate is exposed for connection to another apparatus at a position spaced from a vertical line passing through a longitudinal axis of the terminal.

* * * * *